(12) United States Patent
Lee et al.

(10) Patent No.: US 8,775,745 B2
(45) Date of Patent: Jul. 8, 2014

(54) PROCESS VARIATION TOLERANT BANK COLLISION DETECTION CIRCUIT

(75) Inventors: Jungyong Lee, San Jose, CA (US); Singrong Li, San Jose, CA (US); Heechoul Park, San Jose, CA (US)

(73) Assignee: Oracle International Corporation, Redwood City, CA (US)

( * ) Notice: Subject to any disclaimer, the term of this patent is extended or adjusted under 35 U.S.C. 154(b) by 183 days.

(21) Appl. No.: 13/618,195

(22) Filed: Sep. 14, 2012

(65) Prior Publication Data
US 2014/0082321 A1 Mar. 20, 2014

(51) Int. Cl.
*G06F 12/08* (2006.01)
*G06F 11/00* (2006.01)
*G06F 12/14* (2006.01)

(52) U.S. Cl.
CPC .......... *G06F 12/1425* (2013.01); *G06F 11/004* (2013.01)
USPC .................... 711/150; 711/201; 711/E12.078; 710/36

(58) Field of Classification Search
CPC .............. G06F 11/004; G06F 12/1416; G06F 12/1425; G06F 2212/1008
USPC ..................... 711/150, 201, E12.078; 710/36
See application file for complete search history.

(56) References Cited

U.S. PATENT DOCUMENTS 7,793,082 B2 * 9/2010 Bull et al. ...................... 712/220
8,521,979 B2 * 8/2013 LaBerge et al. ............... 711/167

* cited by examiner

*Primary Examiner* — Hal Schnee
(74) *Attorney, Agent, or Firm* — Marsh Fischmann & Breyfogle LLP

(57) ABSTRACT

A process variation tolerant collision detection apparatus for use in detecting collisions in a multibank memory. The apparatus may receive a plurality of memory commands for execution at the multibank memory. The plurality of memory commands may be compared by an index address comparator and a bank address comparator to generate an index match signal and a bank match signal. The index match signal and the bank match signal may be analyzed by a timing correction module such that errors associated with process variation of the signals used in the system may be eliminated. Accordingly, a corrected index match signal and a corrected bank match signal may be provided to a collision detection circuit to determine whether a collision exits.

20 Claims, 6 Drawing Sheets

PROCESS VARIATION TOLERANT BANK COLLISION DETECTION CIRCUIT

BACKGROUND

In computing environments, memory is employed to store data for use in, or resulting from execution of, computations associated with computing functionality of the computing environment. The speed and accuracy with which data may be written to and read from memory may be a limiting factor regarding the speed at which a computing environment may be executed. In this regard, it may be appreciated that the ability to accurately and rapidly write data to and read data from a memory may improve the speed at which the computing environment may be executed and, thus, improve the computing efficiency of the computing environment.

One example of particular type of memory that may assist in the rapid execution of read and write functionality with respect to a memory includes a multibank memory. A multibank memory includes a plurality of memory banks, each having a plurality of indexes corresponding to memory locations at which data may be stored. In this regard, multibank memory may be useful because independent memory commands (e.g., write and/or read commands) may be addressed to, and carried out with respect to, different respective ones of the plurality of memory banks simultaneously, thus improving the speed and efficiency of the memory.

However, in the use of a multibank memory, a condition may exist where memory commands addressed to the multibank memory may not be properly executed in the memory. These conditions may be referred to as a collision. For example, where more than one memory command is addressed to different indexes in the same memory bank, the memory commands may be not able to be executed, and a collision may occur should the memory commands be attempted. Accordingly, absent a mechanism to detect the potential collision, execution of colliding memory commands may result in false reads, false writes, corrupted memory, or other problems that may detract from the accuracy and speed from which, or to which, the memory may be read or written. Accordingly, detection of data collisions may be desirable by way of scrutinizing memory commands to detect the occurrence of a data collision.

SUMMARY

In view of the foregoing, the present disclosure is generally directed to an apparatus for a memory bank collision detection circuit. In particularly, the present disclosure presents embodiments that may be tolerant to process variations associated with signals used by the apparatus to determine a collision. Such process variation may result in signals used by a detection circuit to falsely indicate a collision exists. For instance, process variation may be associated with variations with respect to tolerances in the manufacturing process of hardware used to generate and/or process signals in a computing environment. Other factors may also contribute to process variation including, for example, skewed signals, a different number of gates employed relative to different signals, or other factors that result in signals being offset or misaligned. However, the embodiments disclosed herein may facilitate compensation or correction mechanisms used to detect collisions while avoiding false detection situations attributable only to process variations. Accordingly, an apparatus for fast, accurate writing to and reading from a multibank memory may be facilitated that reduces the potential for false data collisions detection due to process variations.

In this regard, a first aspect described herein includes an apparatus for collision detection in a multibank memory with protection from false collision detection resulting from process variation. The apparatus includes a memory bank address comparator for receiving bank address data corresponding to a first memory command and a second memory command. The memory bank address comparator is operable to output a bank match signal indicative of the first memory command and the second memory command being directed to a common memory bank address. The apparatus further includes a memory index address comparator for receiving index address data corresponding to the first memory command and the second memory command. The memory index address comparator is operable to output an index match signal indicative of the first memory command and the second memory command being directed to a common memory index address. The apparatus further includes a collision detection circuit comprising a timing correction module that is operable to receive the bank match signal and the index match signal and generate at least one of a corrected bank match signal or a corrected index match signal in response to a change detected in one of the index match signal or bank match signal attributable to process variation. The collision detection circuit is also operable to compare the at least one of the corrected bank match signal or the corrected index match signal to generate a collision detection signal indicative of a collision in the multibank memory resulting from the execution of the first memory command and the second memory command.

A number of feature refinements and additional features are applicable to the first aspect. These feature refinements and additional features may be used individually or in any combination. As such, each of the following features that will be discussed may be, but are not required to be, used with any other feature or combination of features of the first aspect.

For example, in an embodiment, at least one of the bank match signal or the index match signal may include process variation resulting in an offset between the bank match signal and the index match signal. Accordingly, the offset may results in the false detection of a collision. Furthermore, the at least one of the corrected bank match signal or the corrected index match signal may reflect a state of a corresponding one of the bank match signal or the index match signal without the process variation. The process variation may be detected based on a comparison of at least two of the bank match signal, the corrected index match signal, the first memory command, and the second memory command.

In an application, at least one of the corrected bank match signal or the corrected index match signal is at least partially based on a change in a corresponding one of the index match signal or the bank match signal without detection of a corresponding change in at least one of the first memory command, the second memory command or the other of the index match signal or bank match signal. The change in the corresponding one of the index match signal or the bank match signal attributable to process variation is not reflected in the at least one of the corrected bank match signal or the index match signal. The offset may result from at least one of the bank match signal or the index match signal varying from a first value to a second value without a corresponding variation in at least one of the first memory command, the second memory command or the other of the index match signal or the bank match signal.

In an embodiment, the at least one corrected bank match signal or the corrected index match signal may be different than a corresponding one of the bank match signal or the index match signal, respectively. Furthermore, the index match signal may vary from the first value to the second value. In turn, the timing correction module may be operable to maintain the corrected index match signal at the first value at least until a corresponding change in at least one of the first memory command, the second memory command, or the other of the index match signal or the bank match signal.

In an embodiment, the first memory command may include a read command and the second memory command comprises a write command. As such, the first memory command and the second memory command may result in a bypass condition. In an embodiment, the execution of the first memory command and the second memory command may be prevented in response to the collision detection signal generated by the collision detection circuit. As such, the collision detection signal may be communicated to the multibank memory.

A second aspect described herein includes a method for detection of a collision. The method includes receiving a first memory command having an address comprising a first bank address and a first index address and a second memory command having an address comprising a second bank address and a second index address. The method also includes comparing the first bank address with the second bank address to generate a bank match signal indicative of whether the first bank address and the second bank address are the same. Additionally, the method includes evaluating the first index address with the second index address to generate an index match signal indicative of whether the first index address and the second index address are the same. The method also includes detecting a change in one of the bank match signal or the index match signal resulting from process variation and generating at least one of a corrected bank match signal or a corrected index match signal in response to the detecting. The method may also include outputting, in response to the maintaining, a collision detection signal based on the at least one of the corrected bank match signal or the corrected index match signal.

A number of feature refinements and additional features are applicable to the second aspect. These feature refinements and additional features may be used individually or in any combination. As such, each of the following features that will be discussed may be, but are not required to be, used with any other feature or combination of features of the second aspect.

For example, in an embodiment, the generating may include maintaining the corrected index match signal constant in response to a change in the index match signal so long as the bank match signal is constant. The maintaining may be interrupted upon a change in the bank match signal, or the maintaining may be interrupted by a detected change in at least one of the first memory command or the second memory command. In an embodiment, the collision detection signal may be indicative of a collision when a comparison of at least one of the corrected bank match signal or the corrected index match signal indicates the first bank address and the second bank address are the same and the first index address and the second index address are different. In an embodiment, the bank match signal and the index match signal may indicate a bypass condition prior to the change.

In an embodiment, the method may also include preventing execution of the first memory command and the second memory command when the collision detection signal indicates a collision.

A third aspect described herein includes an apparatus for collision detection with protection for process tolerance variations. The apparatus includes a comparison means for comparing a first memory command and a second memory command to generate a bank match signal indicative of whether the first memory command was addressed to a common bank address as the second memory command and to generate an index match signal indicative of whether the first memory command was addressed to a common index address as the second memory command. The apparatus also includes a timing correction means for generating at least one corrected signal. The at least one corrected signal corresponds to a correction of at least one of the bank match signal or the index match signal in response to a detected process variation. The apparatus further includes a collision detection means for analyzing the corrected collision detection signal relative to at least one of the bank match signal or the index match signal to determine a collision.

The present invention is directed to the embodiments and aspects that are summarized above, alone or in any combination, as well as additional embodiments and aspects and combinations thereof that will be apparent from the following description of the invention. However, the foregoing summary is intended to provide a basic understanding of at least some embodiments and aspects of the invention. This summary is not an extensive overview of the invention and is not intended to identify key or critical elements of the invention or to delineate the scope of the invention. The foregoing summary merely presents some concepts of the invention in general form as a prelude to a more detailed description provided below.

DETAILED DESCRIPTION

The following description is not intended to limit the invention to the forms disclosed herein. Consequently, variations and modifications commensurate with the following teachings, skill and knowledge of the relevant art are within the scope of the present invention. The embodiments described herein are further intended to explain modes known of practicing the invention and to enable others skilled in the art to utilize the invention in such, or other embodiments and with various modifications required by the particular applications(s) or use(s) of the present invention.

Figure 1:
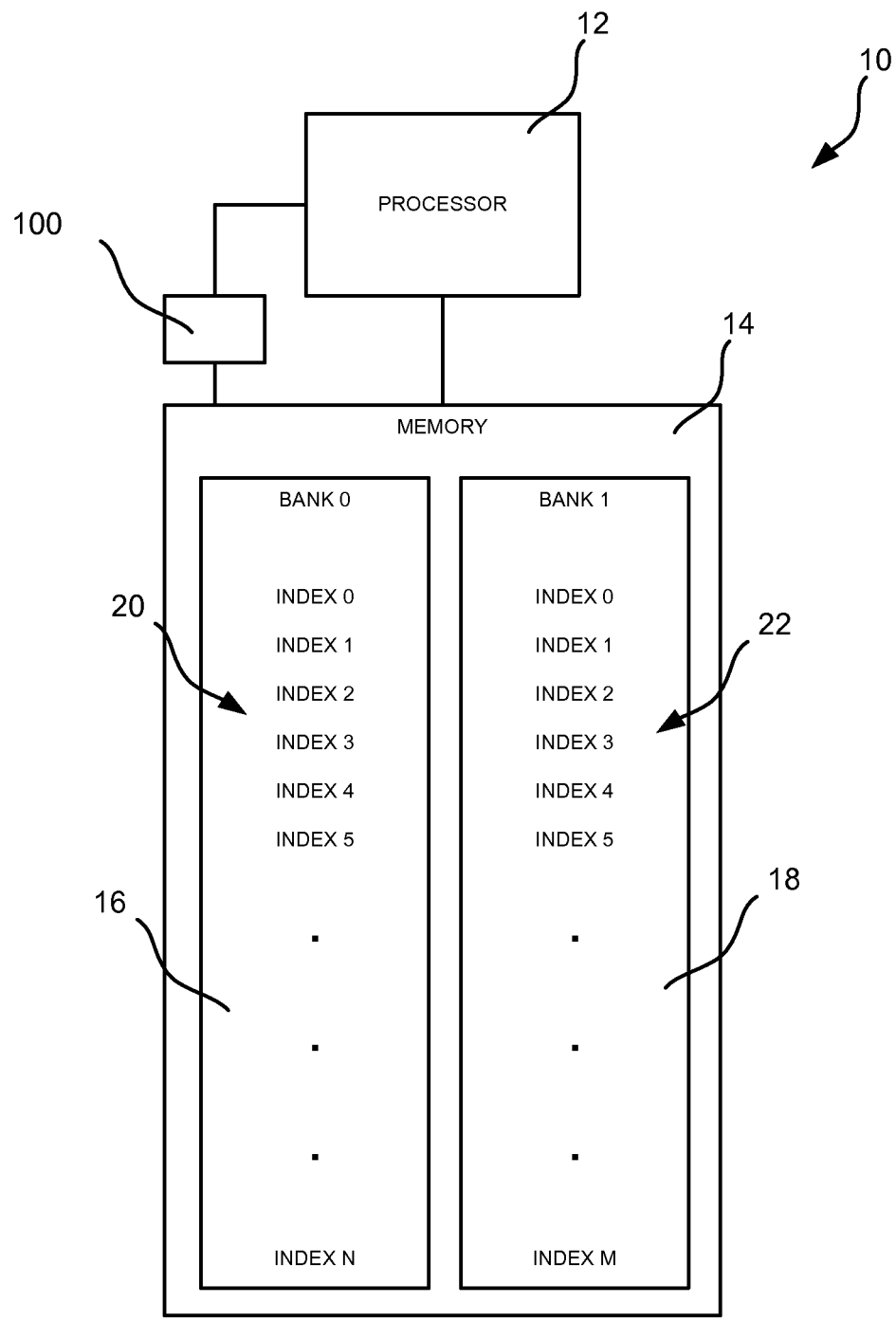
FIG. 1 depicts a schematic view of an embodiment of a computing environment including a multibank memory structure.

With reference to FIG. 1, an embodiment of a computing environment 10 including a multibank memory storage device 14 is depicted. The memory 14 may be in operative communication with a processor 12. The processor 12 may be operable to address memory commands (e.g., read and/or write commands) to the memory 14. The memory commands may be addressed such that each command references a location in the memory 14 to which the memory command is targeted. In this regard, the memory 14 may include a first memory bank 16 having a plurality of index addresses 20 corresponding to various discrete locations in the first memory bank 16. The memory 14 may also include a second memory bank 18 having a plurality of index addresses 22 corresponding to various discrete locations in the second memory bank 18. In this regard, the processor 12 may address each memory command to a particular a bank address as well as an index address such that the location corresponding to the memory command may be identified in the memory 14, and the memory command may be performed with respect to the location. In this regard, a read request or a write request may include address data including an index address and a bank address to which the read request or write request is addressed.

It may be appreciated that allowing for simultaneous read and/or write commands to be addressed to different addresses in the memory 14 may allow for increased efficiency for the memory 14. In this regard, the speed at which data may be written to or read from memory 14 may be increased. For example, the processor 12 may be able to communicate a first memory command to an index address 20 in the first memory bank 16 at the same time that a second memory command is communicated to an index address 22 in the second memory bank 18.

However, as discussed above, the use of a multibank memory 14 may also present the possibility of a collision. For example, when different memory commands are addressed to different index addresses within the same memory bank, a collision may occur that prevents the memory commands from being carried out with respect to the memory 14. The collision may occur due to limited data paths associated with each memory bank such that simultaneous operation in each bank is not possible. In the event the collision is not detected, false reads, false writes, corruption of the memory, or other problems that may detract from the speed or accuracy of the memory 14 may occur.

In this regard, the memory 14 may include or be linked to a apparatus 100 to detect a collision in a manner that will be described in greater detail below. Generally, a collision detection circuit may scrutinize memory commands to determine whether a collision exists, and the collision detection circuit may generate a collision detection signal that is used to prevent the memory commands from being executed should a collision be detected. For example, as described above, a collision may be detected when memory commands are addressed to different indexes in the same bank. However, two memory commands addressed to different banks may not result in a collision. Furthermore, two memory commands addressed to the same index in the same bank may result in a bypass condition which does not represent a collision.

In the bypass condition, the write command may result in the memory location at an index address in a bank being written with data and that newly written data subsequently being read from the memory location. In this regard, a write command addressed to a particular memory location and a read command addressed to the same location may be executed without a collision. Accordingly, while more than one command may be directed to the same bank, the fact that commands are addressed to the same index may allow for the write and read commands to be executed without a collision occurring.

Figure 2:
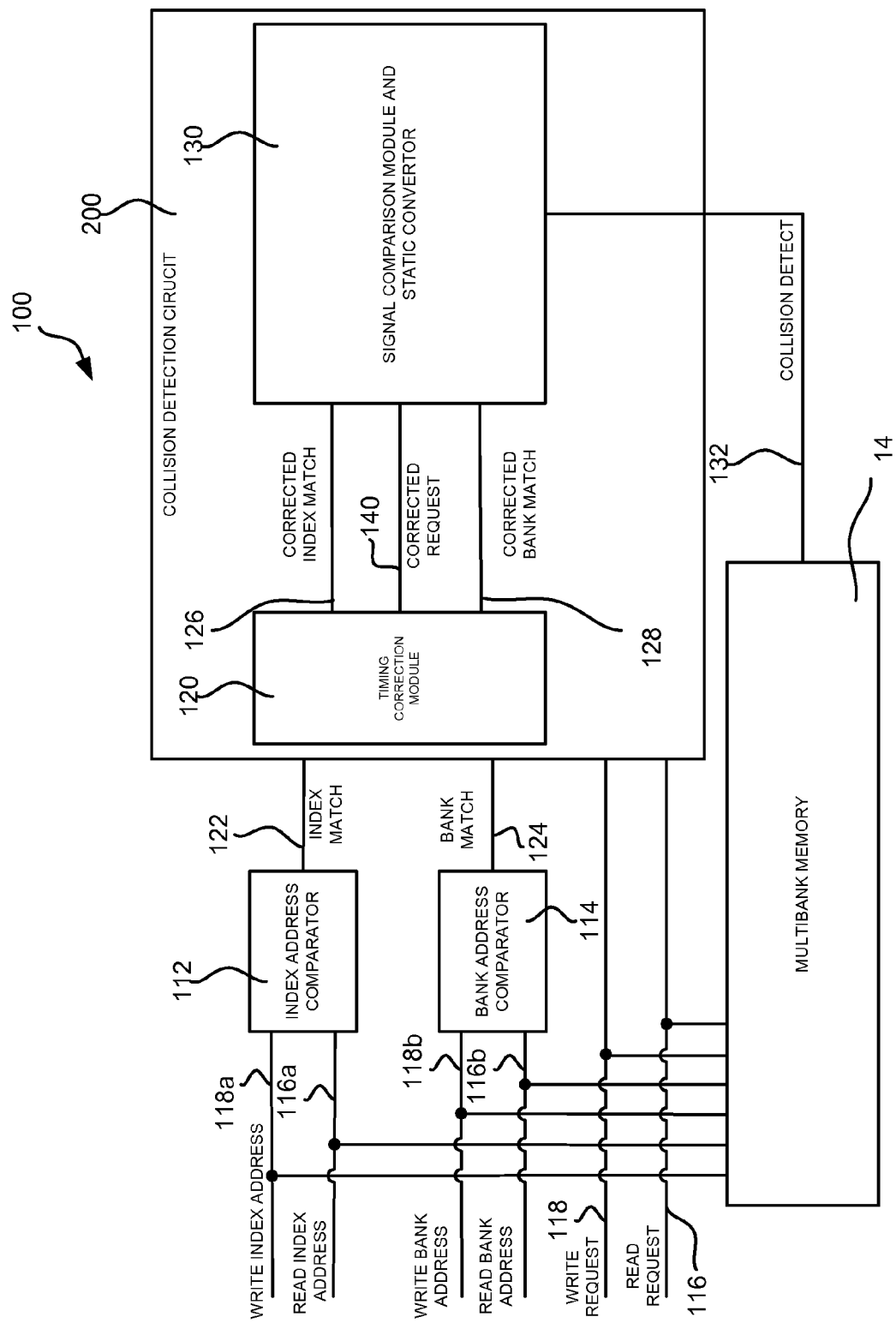
FIG. 2 depicts a schematic view of an embodiment of an apparatus for process variation tolerant collision detection.

With further reference to FIG. 2, a schematic view of the apparatus 100 for use in detecting a collision with respect to the plurality of memory commands communicated to multi-bank memory 14 is depicted. The layout of the apparatus 100 is generally described prior to turning to specific examples of operation of the apparatus 100 with reference to various signal waveform diagrams appearing in FIGS. 3-6.

The apparatus 100 may be operable to receive a read request 116 and a write request 118 (e.g., from processor 12 not shown in FIG. 2). In this regard, as described above each of the read request 116 and the write request 118 may include address data corresponding to a bank address and an index address to which the respective request is addressed. That is, the read request 116 may include a read index address 116a and a read bank address 116b. The write request 118 may include a write index address 118a and a write bank address 118b.

Accordingly, the read index address 116a and the write index address 118a may be communicated to an index address comparator 112. Similarly, the read bank address 116b and the write bank address 118b may be communicated to a bank address comparator 114. It should be noted that while a read request 116 and a write request 118 are depicted and described in detail herein, it may be appreciated that the memory commands may both comprise write commands or may both comprise read commands. The use of read command 116 and write command 118 is for illustration and is not intended to be limiting.

The index address comparator 112 may be operable to analyze index addresses 116a and 118a to determine if the read request 116 and the write request 118 are addressed to a common index address. In the event the read request 116 and the write request 118 are addressed to a common index address, the index address comparator 112 may output an index match signal 122 indicative of the fact the read request 116 and a write request 118 are addressed to a common index address. For example, if the read request 116 and the write request 118 are addressed to a common index address, the index match signal may be high, whereas if the read request 116 and the write request 118 are addressed to different index addresses, the index match signal may be low as will be appreciated with further reference to the signal waveforms in FIGS. 3-6 discussed below.

The bank address comparator 114 may similarly be operable to analyze the bank addresses 116b and 118b to determine if the read request 116 and the write request 118 are addressed to a common bank address. In the event that the read request 116 and the write request 118 are addressed to the common bank address, the bank address comparator 114 may output a bank match signal 124 indicative of that fact. For example, if the read request 116 and the write request 118 addressed a common bank address, the bank match signal 124 may be high, whereas if the requests are addressed to different banks, the bank match signal 124 may be low.

Accordingly, a collision detection circuit 130 may scrutinize the index match signal 122 and the bank match signal 124 to determine whether the read request 116 and the write request 118 represent a collision. However, as may be appreciated below, the index match signal 122 and the bank match signal 124 may be subject to error due to process variation (e.g., resulting from non-ideal characteristics of hardware used in the computing environment 100). In this regard, comparison of the index match signal 122 and the bank match signal 124 may introduce the potential that a false collision is detected. As will become clear below, the false collision may be the result exclusively of process variation present in the signals.

Accordingly, as depicted in FIG. 2, the index address comparator 112 and the bank address comparator 114 may be operable to provide the index match signal 122 and the bank match signal 124, respectively, to a collision detection circuit 200 that may include a timing correction module 120 and a signal comparison module 130. The signal comparison module 130 may also include a static signal generator used to generate static signals for use in the control of the multibank memory 14.

The timing correction module 120 may generate a corrected index match signal 126 and a corrected bank match signal 128 that are in turn provided to signal comparison module 130. The corrected index match signal 126 and the corrected bank match signal 128 may be at least in part based on a comparison of the index match signal 122 and the bank match signal 124. Additionally or alternatively, the corrected index match signal 126 or the corrected bank match signal 128 may be based on a comparison of one or more of the index match signal 122, the bank match signal 124, the read request 116, and the write request 118. In general, the various signals provided to the timing correction module 120 may be analyzed to determine anomalies in the signals attributable to process variation. In this regard, changes in the signals without a corresponding change in a complimentary signal (e.g., a change in the index match signal 122 without a corresponding change in any one or more of the read request 116, the write request 118, or the bank match signal 124) may indicate a change in a signal results only from process variation.

In this regard, and as will be discussed in greater detail below, the corrected index match signal 126 and the corrected bank match signal 128 may be conditioned to remove false signal values resulting solely from process variation. For example, process variation may be associated with any of the various hardware used in the computing environment 100. Such variation may be, for example, due to physical variations in hardware used to generate and/or process the write request 118 and/or read request 116. Such physical variations may be due to process variations introduced in the manufacture of such physical hardware. Furthermore, process variation may exist due to skew in signals, a differing number of gates utilized to generate or process a signal (e.g., resulting in signal latency), or other factors that may result in an offset of the signal values.

Accordingly, the corrected index match signal 126 and the corrected bank match signal 128 may be provided to the signal comparison module 130 for analysis to determine if a collision exists. As the corrected index match signal 126 and the corrected bank match signal 128 may be corrected to remove signal artifacts attributable to process variation, the resulting analysis may be free from false collision detections due to process variation. In this regard, the signal comparison module 130 may output a collision signal 132 to the memory 14 that is indicative of whether the write request 118 and the read request 116 represent a collision. In the event the collision signal 132 indicates a collision, the read request 118 and write request 116 may be prevented from being executed at the memory 14. Furthermore, the collision detection signal 132 may be provided (e.g., to processor 12 not shown in FIG. 2) to indicate the intended memory commands were not executed due to a detected collision. However, if no collision is detected by the signal comparison module 130, the read request 116 and write request 118 may be executed at the memory 14.

Figure 3:
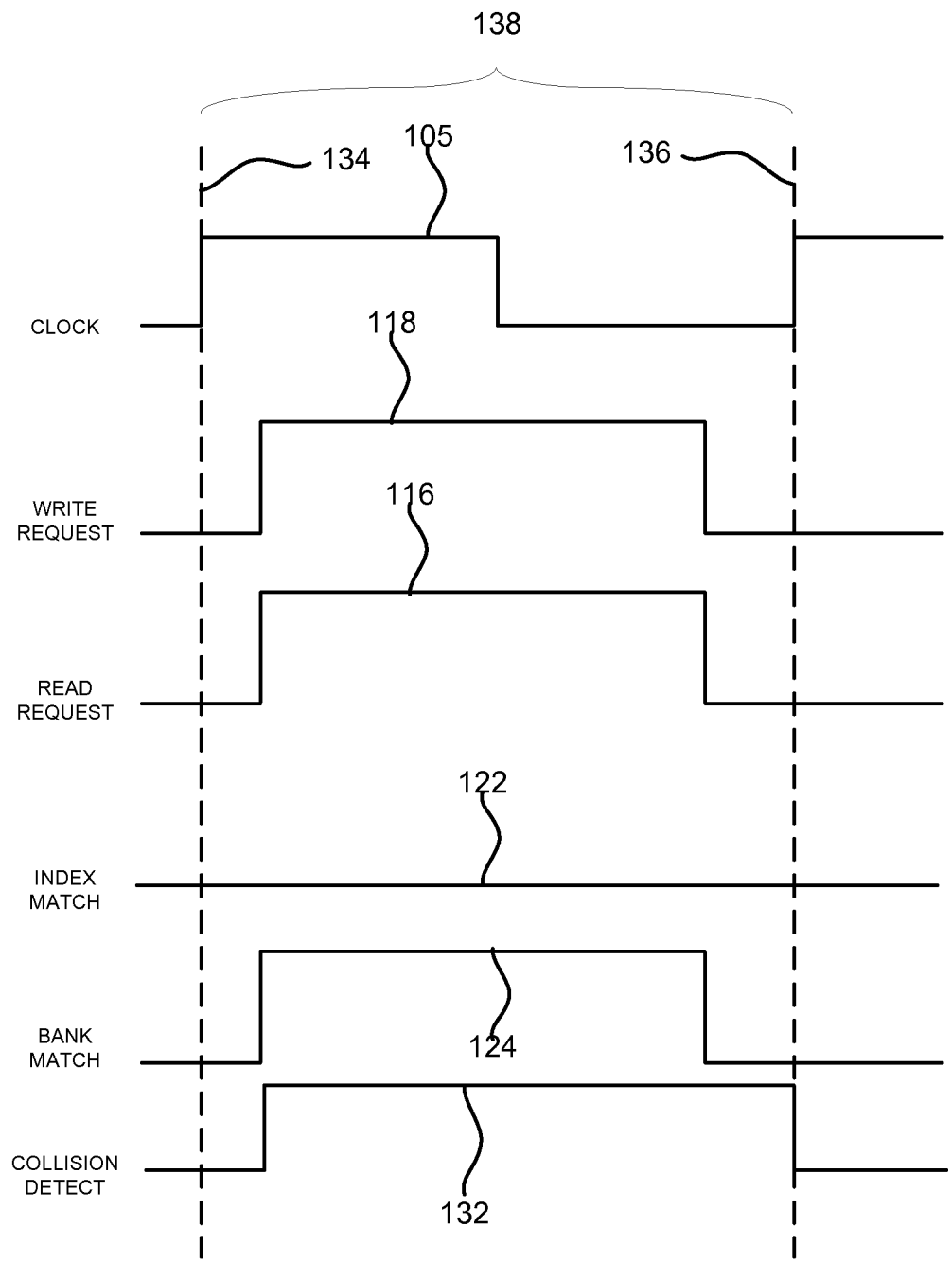
FIG. 3 depicts a plurality of signal waveforms corresponding to the system FIG. 2 when a collision is detected.

With further reference to FIG. 3, signal waveforms corresponding to the various signals described above in the apparatus 100 are shown to illustrate the operation of the apparatus 100. For example, FIG. 3 illustrates the state of various signal waveforms of the apparatus 100 corresponding to a collision scenario as described above where the read command 116 and the write command 118 are received that are directed to different indexes in the same bank. As shown, a clock signal 105 may define a cycle period 138 extending between consecutive rising edges of the clock signal denoted by dotted lines 134 and 136. Also depicted, both the write request 118 and read request 116 signals become high during the cycle period 138 indicating both memory commands are received for execution with respect to the memory 14. The index match signal 122 may remain low during the cycle period 138 indicating that the index address comparator 112 determines that the read request 116 and the write request 118 are directed to different indexes. That is, it will be understood that the read request 116 and the write request 118 may be addressed to different indexes in the multi bank memory block 14 as determined by the index address comparator 112.

Additionally, as shown in FIG. 3, the bank match signal 124 may become high (at a rising edge within the cycle period 138) indicating that the bank address comparator 114 determines the bank addresses for the read request 116 and write request 118 are the same. Thus, the collision detection circuit 130 may indicate a collision signal 132 indicative of a collision because the read request 116 and write request 118 are directed to different index addresses in the same bank as determined from a comparison of the index match signal 122 and the bank match signal 124. In this regard, the collision detection circuit 200 may communicate a collision detection signal 132 that prevent the read request 116 and write request 118 from being executed at the memory 14.

As such, it may be appreciated that the collision detection circuit 200 may be operable to analyze the index match signal 122 and bank match signal 124 to determine whether a collision occurs. It may further be appreciated that if the bank match signal 124 is low, corresponding to a scenario wherein the bank address of the read signal 116 is different than the bank address of the write signal 118, no collision may occur as the addresses correspond to different banks, such that no collision occurs regardless of the state of the index match signal 122.

Figure 4:
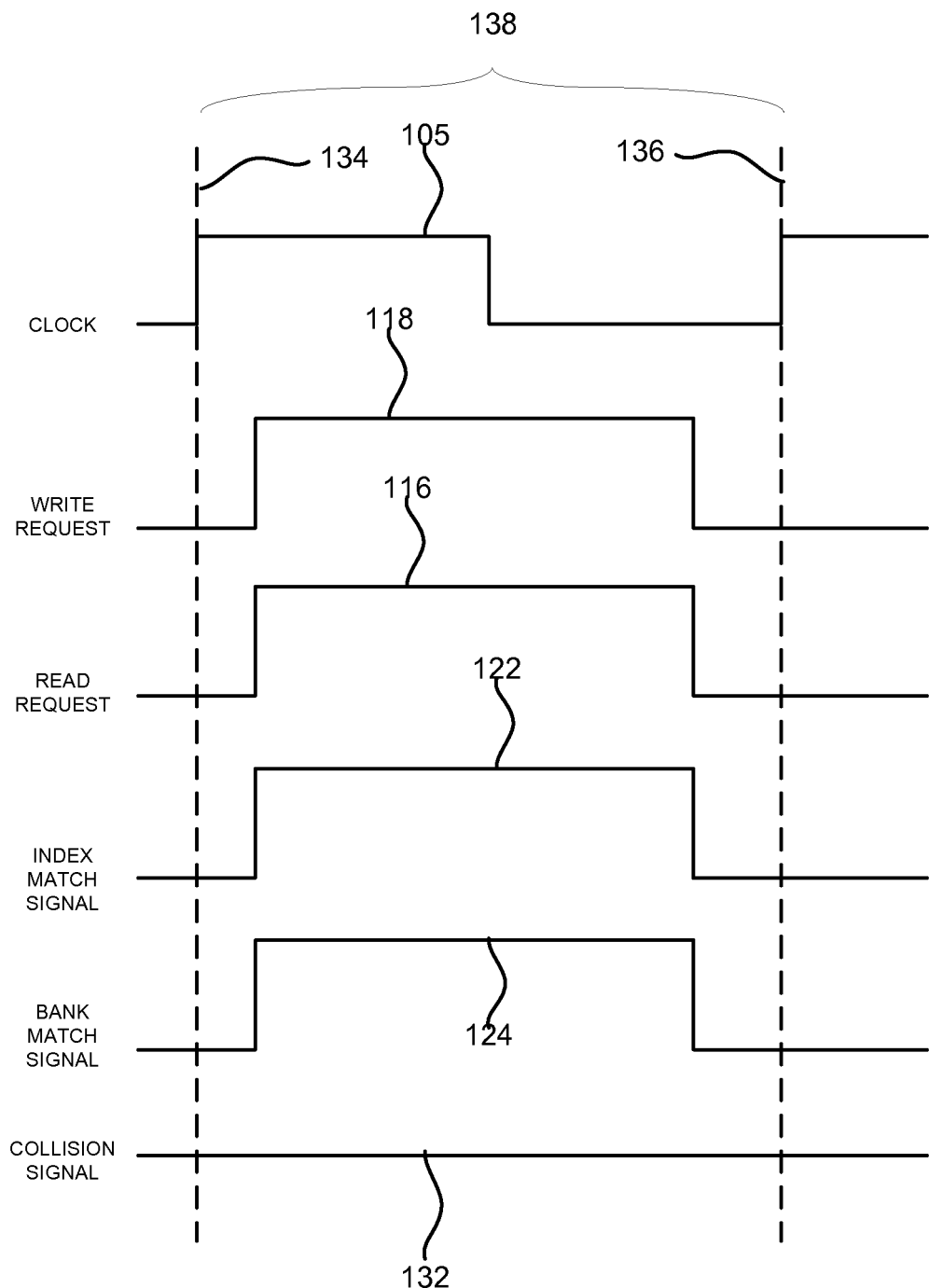
FIG. 4 depicts a plurality of signal waveforms correspond to the system of FIG. 2 corresponding to a bypass condition.

Another scenario is depicted in the signal waveforms of FIG. 4 corresponding to a bypass condition described above. In a bypass condition, a first memory command (e.g., read request 116) and a second memory command (e.g., write request 118) that are directed at the same index address in the same bank may not represent a collision such that both operations may be carried out on the index address in the bank without collision. As such, in FIG. 4 the index match signal 122 and the bank match signal 124 are both indicative that the read request 116 and write request 118 are both directed at the same index address and same bank address. Therefore, the collision detection circuit 200 may be able to ascertain that no collision is detected and output a collision signal 132 as shown in FIG. 4 indicating no collision exists. As such, the read request 116 and write request 118 may be executed at the memory 14.

Figure 5:
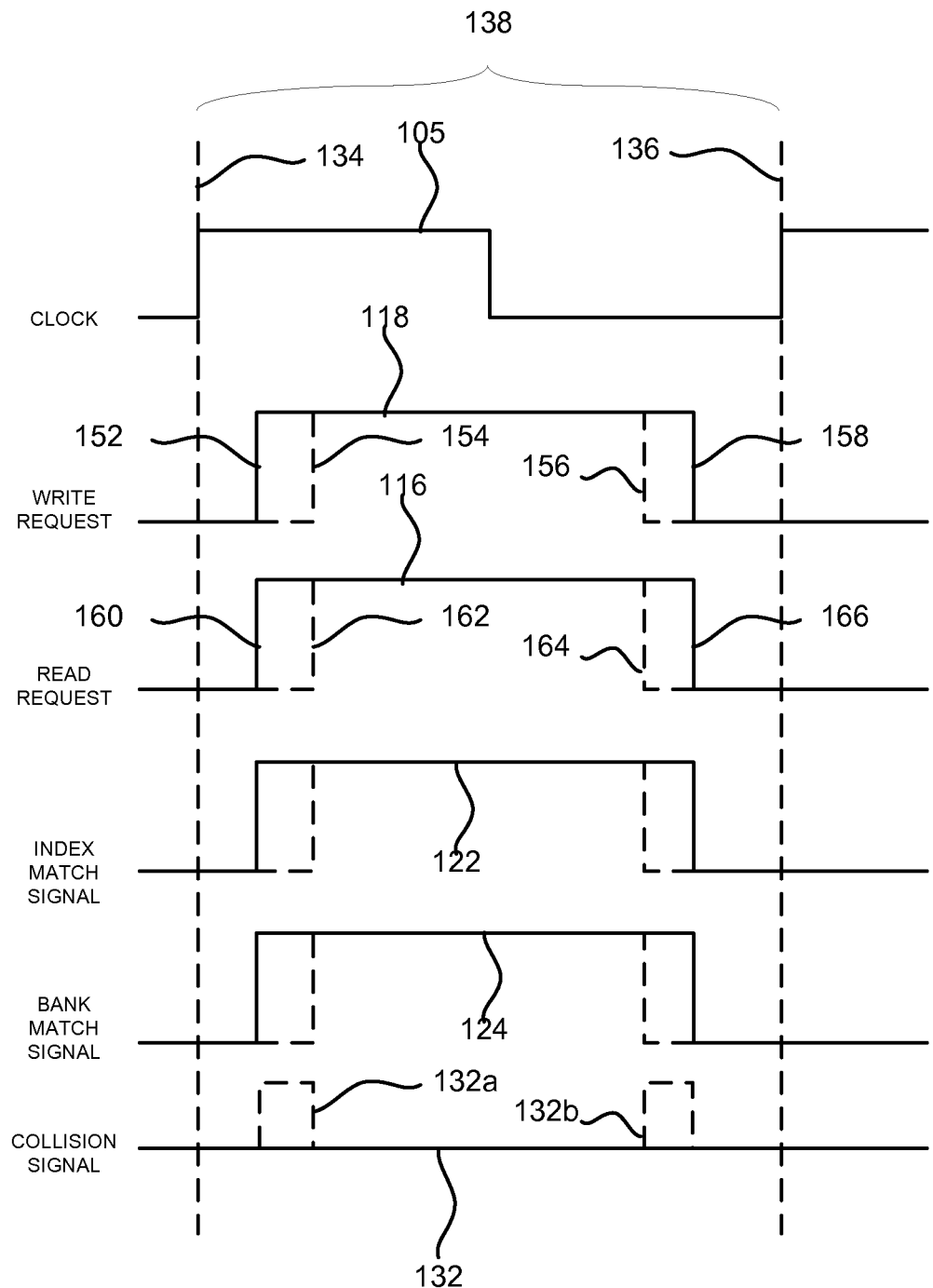
FIG. 5 depicts a plurality of signal waveforms corresponding to the system of FIG. 2 with variations resulting from process variations.

However, with further reference to the signal waveforms of FIG. 5, it may be appreciated that the signals discussed herein may be subject to variation such that the initiation (i.e., the rising edges) and termination (i.e., the falling edges) of the signals may not correspond. As will be appreciated with further reference to FIG. 6, the process variation may lead to scenarios where it appears that a collision occurs for a portion of the clock cycle period 138, when in reality no collision is present and the indicating of a collision is due only to process variation present in the various signals.

For example, as depicted with respect to the write request 118 in FIG. 5, rather than rising edge 152 of an ideal system, the actual rising edge 154 for the write request signal 118 may occur after the idealized rising edge 152 as shown in FIG. 5. Similarly, process variation may exist at the falling edge of the write request 118 such that an actual falling edge 156 may occur rather than an idealized falling edge 158 of an ideal system as depicted in FIG. 5. Similarly, the read request 116 may be subject to non-ideal variation in the signal 116 such that an actual rising edge 162 is experienced rather than idealized rising edge 160. Furthermore, the falling edges of the read signal 116 may be subject to variation such that an actual falling edge 164 varies from an idealized falling edge 166 of the signal.

As may be further appreciated from FIG. 5, the potential variation of the read request 116 and/or write request 118 may result in situations where it appears a collision occurs due to the initiation and/or termination of the signals not corresponding. That is, for instance, the write request 118 may terminate prior to the read request 116 terminating such that it appears that a collision occurs for the cycle period 138, when no actual collision exists. Rather, the resulting indicated collision (e.g., as shown in collision signal value 132*a* and 132*b* in FIG. 5) may be resultant only from an indicated collision detected due to the variation of read request 116 and write request 118. Furthermore, process variation may be introduced at either of the index match signal 122 or the bank match signal 124. For instance, despite the read request 116 and write request 118 corresponding, due to difference in the hardware used to generate the index match signal 122 and the bank match signal 124, variations may exist in the index match signal 122 or bank match signal 124. It may be appreciated that the process variation introduced in either of these signals may also result in false collision detection signals 132*a* or 132*b* being detected.

In this regard, the process variation of any of the various signals used to detect collisions may result in false collision signals being generated such as false collision signal 132*a* or false collision signal 132*b*. While not discussed explicitly in examples herein, FIG. 5 depicts a plurality of process variations that may occur with respect to any of the signals used to monitor for a collision such that may process variations may result in errors being carried through to or generated in the index match signal 122 and bank match signal 124 shown in FIG. 5. In this regard, the efficiency of the apparatus 100 may be reduced due to false detection of collisions as memory commands may be prevented from being executed in the memory 14 even without an actual collision. In this light, the timing correction module 120 of the apparatus 100 may be operable to compare the index match signal 122 and/or the bank match signal 124 with respect to others of the signals to generate the corrected index match signal 126 and corrected bank match signal 128 to eliminate errors introduced by way of process variation. That is, the corrected index match signal 126 and the corrected bank match signal 128 may be conditioned to remove errors occurring therein due to process variations. As such, the timing correction module 120 may prevent false collision signals 132*a* or 132*b*. For example, either of the index match signal 122 or bank match signal 124 may be compared to the other of the index match signal 122 or bank match signal 124 to determine if process variation exists. For example, if the index match signal 122 changes from one value to another (i.e., goes from high to low) without a corresponding change in the bank match signal 122, the change in the index match signal 122 may be attributed to process variation. Alternatively or additionally, either or both of the memory commands (e.g., read signal 116 or write signal 118) may be analyzed upon detection of a change in either of the index match signal 122 or bank match signal 124 to determine if the change results from a corresponding change in the memory commands. Absent a corresponding change in the memory commands, the change may be attributed to a process variation. As such, the corrected index match signal 126 and corrected bank match signal 128 may not include such a changed determined to be resulting from process variation.

Figure 6:
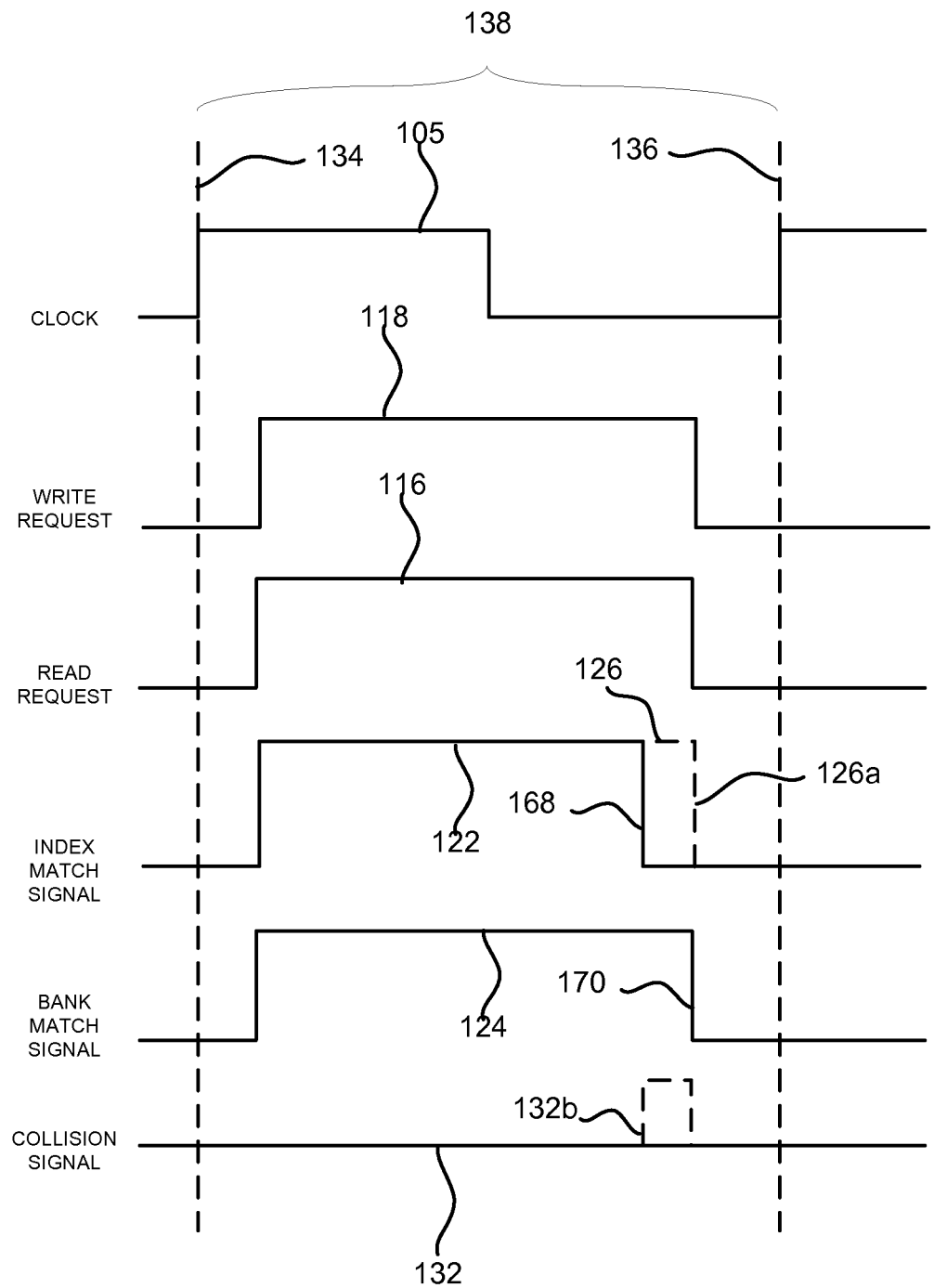
FIG. 6 depicts a plurality of signal waveforms correspond to the system of FIG. 2 wherein embodiment of the apparatus for bank collision detection with process tolerance variations has been applied to the signal waveforms.

For example, with further reference to FIG. 6, a scenario is depicted where a false collision signal 132*b* may exist that is attributable only to process variation resulting from the index match signal 122 having a falling edge 168 offset from the falling edge 170 of the bank match signal 124. That is, because the index match signal 122 changes from a first value (high) to a second value (low) prior to a corresponding change in any of the bank match signal 124, read request 116, or write request 118, the index match signal 122 may falsely indicate that the read request 116 and write request 118 represent a collision. Therefore, for a first period the collision detection circuit 130 may determine that the signals correspond to a bypass condition such that no collision is detected. This may be indicated in the collision signal 132. However, in a second period beginning at the premature termination of the index match signal 122 at falling edge 168, the collision detection circuit 130 may falsely indicate a collision for a portion of the cycle period 138. However, the indication of a collision may be attributable only to the offset between the termination of the index match signal 122 and the bank match signal 124.

In this regard, the timing correction module 120 may be operable to generate a corrected index match signal 126 that compensates for the error introduced by the process variation. That is, the timing correction module 120 may be operable to compare the index match signal 122 to the bank match signal 124, the read request 116, and/or the write request 118 to determine the change at the falling edge 168 is not generated from an actual change in the various signal states. As such, the change may be attributed to process variation and the corrected index match signal 126 may maintain the value prior to the change at falling edge 168. The corrected index match signal 126 may be maintained until a corresponding change in one or more of the bank match signal 124, read request 116, or write request 118 is also detected. In this regard, as depicted in FIG. 6, for example, the corrected index match signal 126 with falling edge 126*a* may be provided to the signal comparison module 130. Based on the corrected index match signal 126, the signal comparison module 130 may properly determine no collision exists such that the read request 116 and write request 118 are issued to the memory 14.

In this regard, it may be appreciated that the timing correction module 120 may be operable to maintain one or both of the index match signal 122 or bank match signal 124 constant during a duration of the cycle period 138 despite contradictory values being received from the index address comparator 112 or bank address comparator 114. In this regard, the collision detection circuit 200 may also receive the read request 116 and write request 118 in order to scrutinize the read request 116 and write request 118 in the generation of the corrected index match signal 126. As such, the timing correction module 120 may compare the read request 116 and/or write request 118 to determine when either one of the corrected index match signal 126 or corrected bank match signal 128 should remain at the constant value despite a change in one of the index match signal 122 or bank match signal 124. For example, in FIG. 6, the timing correction module 120 may maintain the corrected index match signal 126 constant until the read request 116 changes at the falling edge 116*d* or the bank match signal 124 changes at falling edge 170. In this regard, the timing correction module 120 may maintain the corrected index match signal 126 and/or corrected bank match signal 128 constant until a value of the read request 116, write request 118 changes, or the other of the bank match signal 124 or index match signal 122.

Furthermore, while discussed above with respect to a corrected index match signal 126 or a corrected bank match signal 128, it may be understood that other signals may also be corrected to remove defects from process variation by the timing correction module 120. In this regard, process variation detected in the read request 116 or the right request 118 may be detected and a corrected request signal 140 corresponding to either or both the read request 116 and write request 118 may be provided to the signal comparison module 130 for determination of a collision.

In view of the foregoing, an apparatus 100 for detection of collisions may be provided that reduces the potential for false collisions being detected because of process variation. As such, more efficient, faster execution of the memory 14 may be facilitated. In this regard, the overall efficiency and/or speed at which a computing environment may be executed may in turn be increased.

While various embodiments of the present invention have been described in detail, it is apparent that further modifications and adaptations of the invention will occur to those skilled in the art. However, it is to be expressly understood that such modifications and adaptations are within the spirit and scope of the present invention.

What is claimed is:

1. An apparatus for collision detection in a multibank memory, comprising:
   a memory bank address comparator for receiving bank address data corresponding to a first memory command and a second memory command, wherein the memory bank address comparator is operable to output a bank match signal indicative of the first memory command and the second memory command being directed to a common memory bank address;
   a memory index address comparator for receiving index address data corresponding to the first memory command and the second memory command, wherein the memory index address comparator is operable to output an index match signal indicative of the first memory command and the second memory command being directed to a common memory index address; and
   a collision detection circuit comprising a timing correction module that is operable to receive the bank match signal and the index match signal and generate at least one of a corrected bank match signal or a corrected index match signal in response to a change detected in one of the index match signal or bank match signal attributable to process variation;
   wherein the collision detection circuit is operable to compare the at least one of the corrected bank match signal or the corrected index match signal to generate a collision detection signal indicative of a collision in the multibank memory resulting from execution of the first memory command and the second memory command.

2. An apparatus according to claim 1, wherein at least one of the bank match signal or the index match signal includes an error due to process variation resulting in an offset between the bank match signal and the index match signal, and wherein the offset results in false detection of a collision.

3. An apparatus according to claim 2, wherein the at least one of the corrected bank match signal or the corrected index match signal reflects a state of a corresponding one of the bank match signal or the index match signal without the process variation.

4. An apparatus according to claim 3, wherein the process variation is detected based on a comparison of at least two of the bank match signal, the corrected index match signal, the first memory command, and the second memory command.

5. An apparatus according to claim 2, wherein the at least one of the corrected bank match signal or the corrected index match signal is at least partially based on a change in a corresponding one of the index match signal or the bank match signal without detection of a corresponding change in at least one of the first memory command, the second memory command or the other of the index match signal or bank match signal.

6. An apparatus according to claim 5, wherein the change in the corresponding one of the index match signal or the bank match signal attributable to process variation is not reflected in the at least one of the corrected bank match signal or the index match signal.

7. An apparatus according to claim 2, wherein the offset results from at least one of the bank match signal or the index match signal varying from a first value to a second value without a corresponding variation in at least one of the first memory command, the second memory command or the other of the index match signal or the bank match signal.

8. An apparatus according to claim 7, wherein the at least one corrected bank match signal or the corrected index match signal is different than a corresponding one of the bank match signal or the index match signal, respectively.

9. An apparatus according to claim 8, wherein the index match signal varies from the first value to the second value, and wherein the timing correction module is operable to maintain the corrected index match signal at the first value at least until a corresponding change in at least one of the first memory command, the second memory command, or the other of the index match signal or the bank match signal.

10. An apparatus according to claim 9, wherein the first memory command comprises a read command and the second memory command comprises a write command, and wherein the first memory command and the second memory command result in a bypass condition.

11. An apparatus according to claim 1, wherein the execution of the first memory command and the second memory command is prevented in response to the collision detection signal generated by the collision detection circuit.

12. An apparatus according to claim 11, wherein the collision detection signal is communicated to the multibank memory.

13. A method for detection of a collision, comprising:
   receiving a first memory command having an address comprising a first bank address and a first index address and a second memory command having an address comprising a second bank address and a second index address;
   comparing the first bank address with the second bank address to generate a bank match signal indicative of whether the first bank address and the second bank address are the same;
   evaluating the first index address with the second index address to generate an index match signal indicative of whether the first index address and the second index address are the same;
   detecting a change in one of the bank match signal or the index match signal resulting from process variation;
   generating at least one of a corrected bank match signal or a corrected index match signal in response to the detecting; and
   outputting a collision detection signal based on the at least one of the corrected bank match signal or the corrected index match signal.

14. A method according to claim 13, wherein the generating comprises maintaining the corrected index match signal constant in response to a change in the index match signal so long as the bank match signal is constant.

15. A method according to claim 14, wherein the maintaining is interrupted upon a change in the bank match signal.

16. A method according to claim 15, wherein the maintaining is interrupted by a detected change in at least one of the first memory command or the second memory command.

17. A method according to claim 16, wherein the collision detection signal is indicative of a collision when a comparison of at least one of the corrected bank match signal or the corrected index match signal indicates the first bank address and the second bank address are the same and the first index address and the second index address are different.

18. A method according to claim 13, wherein the bank match signal and the index match signal indicate a bypass condition prior to the change.

19. A method according to claim 13, further comprising preventing execution of the first memory command and the second memory command when the collision detection signal indicates a collision.

20. A system for collision detection relating to a multibank memory, comprising:
 a processor for generating a first memory command and a second memory command;
 a memory bank address comparator in operative communication with the processor for receiving bank address data corresponding to the first memory command and the second memory command, wherein the memory bank address comparator is operable to output a bank match signal indicative of the first memory command and the second memory command being directed to a common memory bank address;
 a memory index address comparator in operative communication with the processor for receiving index address data corresponding to the first memory command and the second memory command, wherein the memory index address comparator is operable to output an index match signal indicative of the first memory command and the second memory command being directed to a common memory index address; and
 a collision detection circuit comprising a timing correction module that is operable to receive the bank match signal and the index match signal and generate at least one of a corrected bank match signal or a corrected index match signal in response to a change detected in one of the index match signal or bank match signal attributable to process variation;
 wherein the collision detection circuit is operable to compare the at least one of the corrected bank match signal or the corrected index match signal to generate a collision detection signal indicative of a collision in the multibank memory resulting from execution of the first memory command and the second memory command.

* * * * *